United States Patent
Teng et al.

(10) Patent No.: US 11,326,033 B2
(45) Date of Patent: May 10, 2022

(54) METHOD TO OPTIMIZE ATOMIC LAYER DEPOSITION

(71) Applicant: BenQ Materials Corporation, Taoyuan (TW)

(72) Inventors: Shih-Chieh Teng, Taoyuan (TW); Ju-Hui Huang, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 276 days.

(21) Appl. No.: 16/801,225

(22) Filed: Feb. 26, 2020

(65) Prior Publication Data

US 2021/0189081 A1 Jun. 24, 2021

(30) Foreign Application Priority Data

Dec. 19, 2019 (TW) .................................. 108146690

(51) Int. Cl.
| | |
|---|---|
| *H01L 23/29* | (2006.01) |
| *C08J 7/048* | (2020.01) |
| *C08J 7/04* | (2020.01) |
| *C23C 16/455* | (2006.01) |
| *C23C 16/40* | (2006.01) |
| *H01L 33/56* | (2010.01) |

(52) U.S. Cl.
CPC ............. *C08J 7/048* (2020.01); *C08J 7/0427* (2020.01); *C23C 16/403* (2013.01); *C23C 16/45536* (2013.01); *C23C 16/45553* (2013.01); *H01L 33/56* (2013.01); *C08J 2383/07* (2013.01); *C08J 2401/02* (2013.01)

(58) Field of Classification Search
CPC ......... H01L 33/56; C08J 7/048; C08J 7/0427; C23C 16/403; C23C 16/45536; C23C 16/45553; C08L 2205/16; C08B 7/00
USPC ........................................................ 257/791
See application file for complete search history.

(56) References Cited

U.S. PATENT DOCUMENTS

| | | | |
|---|---|---|---|
| 2014/0073776 A1* | 3/2014 | Shiramizu | ............... C08L 69/00 536/69 |
| 2017/0226398 A1* | 8/2017 | Shimaoka | ................. C08B 5/00 |

* cited by examiner

*Primary Examiner* — Brook Kebede

(57) ABSTRACT

The disclosure provides a method to optimize atomic layer deposition comprising the following steps: (A) providing a cellulose nanofiber; (B) acidifying the cellulose nanofiber by an acidifying treatment agent; (C) hydrophobing the acidified cellulose nanofiber by a hydrophobinghydrophobic treatment agent; (D) dissolving the acidified and hydrophobed cellulose nanofiber in a solvent to form a cellulose nanofiber solution; (E) coating the cellulose nanofiber solution on a silicone resin film; (F) heating the coated silicone resin film to form a cellulose nanofiber layer on a surface of the silicone resin film; and (G) forming an inorganic coating layer on the surface of the silicone resin film having the cellulose nanofiber layer by atomic layer deposition.

15 Claims, No Drawings

METHOD TO OPTIMIZE ATOMIC LAYER DEPOSITION

This application claims the benefit of Taiwanese application serial No. 108146690, filed on Dec. 19, 2019, the subject matter of which is incorporated herein by reference.

BACKGROUND OF THE INVENTION

Field of the Invention

The present disclosure is directed to a method to optimize atomic layer deposition and particularly a method to enhance the coating quality of an inorganic coating layer coated on a cellulose nanofiber modified surface of a silicone resin film.

Description of the Related Art

Comparing to traditional lighting devices, LEDs are widely developed because they are advantages of small size, high lighting efficiency, long working life, high safety, high response time, rich colors, no heat radiation and no mercury or other poisons polluted to environment. LEDs can be widely used in lighting for buildings, consumptive handheld lighting devices, retailed displaying light devices and housing lighting devices.

Conventional LED package comprises lead frames, LED chips and encapsulated gel. Conventional gas barrier is formed by coating an $Al_2O_3$ layer on a polymer substrate with a better water vapor barrier property such as PET or PEN substrate by atomic layer deposition. However, the flexibility and the molding ability of PET or PEN are not good enough to be applied in high-end LEDs encapsulated by chip scale package technology (CSP).

Silicone resins are widely used as the encapsulated gels because of their excellent heat-resistance and light-resistance. However, the Si—O—Si bonding angle in the silicone resin is bigger, which will result in poor water vapor barrier property of the silicone resin, and phosphors or quantum dots in the LED package will be prone to be wet and led to the decay of color or emitting light. Although, it is known that the water vapor barrier property of the silicone gel can be enhanced by increasing the cross-link density thereof or adding nanoparticles, but the enhancing effect is limited. In addition, because the Coefficient of Thermal Expansion (CTE) of the silicone gel is higher which will result in greater thermal stress during the atomic layer deposition coating to form the inorganic coating layer and cause a compact inorganic thin film not be easily formed on the surface of the silicone gel, and thus, the gas barrier property of the silicone resin film as a gas barrier film will decrease. Moreover, the silicone resin film is more hydrophobic because the hydrophilic function groups necessary for the atomic layer deposition coating such as the hydroxyl group, the amino group and the carboxyl group are not present on the surface thereof, thereby the covering rate and quality of the coating layer formed on the surface thereof by the atomic layer deposition is poor. It is difficult to form a compact and plain inorganic coating layer on the surface of the silicone resin film.

Therefore, a novel method to optimize atomic layer deposition which can enhance the coating quality of an inorganic coating layer coated on a silicone resin film is demanded to provide enough water vapor barrier property and high workability for packaging LEDs, and maintain necessary optical properties for LEDs.

SUMMARY OF THE INVENTION

The present invention provides a method to optimize atomic layer deposition, wherein the water vapor barrier property of a silicone resin layer can be enhanced by this method, thereby the silicone resin film with water vapor barrier property can be used to encapsulate LEDs by the so-called chip-scaled package technology (CSP) and maintain the optical properties of LED.

The present invention provides a method to optimize atomic layer deposition comprising the following steps: (A) providing a cellulose nanofiber; (B) acidifying the cellulose nanofiber by an acidifying treatment agent; (C) hydrophobing the acidified cellulose nanofiber by a hydrophobic treatment agent; (D) dissolving the acidified and hydrophobed cellulose nanofiber in a solvent to form a cellulose nanofiber solution; (E) coating the cellulose nanofiber solution on a silicone resin film; (F) heating the coated silicone resin film to form a cellulose nanofiber layer on a surface of the silicone resin film; and (G) forming an inorganic coating layer on the surface of the silicone resin film having the cellulose nanofiber layer by atomic layer deposition.

In one embodiment of the method to optimize atomic layer deposition, wherein the concentration of the cellulose nanofiber solution of step of (D) is in the range of 0.05% to 0.3%.

In one embodiment of the method to optimize atomic layer deposition, wherein the solvent of step of (D) can be at least one of water, toluene, methanol, ethanol, iso-propanol, proprylene glycol monomethyl ether, tert-butanol, butanone and tetrahydrofuran, or combinations thereof.

In one embodiment of the method to optimize atomic layer deposition, wherein the thickness of the cellulose nanofiber layer of step of (F) is in the range of 0.2 µm to 1.6 µm, and preferably in the range of 0.8 µm to 1.0 µm.

In one embodiment of the method to optimize atomic layer deposition, wherein the heating treatment of step (F) is proceed at the temperature in the range of 40° C. to 120° C. for 1 minute to 30 minutes.

In one embodiment of the method to optimize atomic layer deposition, wherein the thickness of the inorganic coating layer of the step of (G) is in the range of 10 nm to 300 nm.

In one embodiment of the method to optimize atomic layer deposition, wherein the inorganic coating layer of the step of (G) includes $SiO_2$, $Al_2O_3$, $HfO_2$ or combinations thereof.

In one embodiment of the method to optimize atomic layer deposition, wherein the acidifying treatment agent of the step of (B) includes hydrochloric acid, sulfuric acid, nitric acid, acetic acid or triflic acid.

In one embodiment of the method to optimize atomic layer deposition, wherein the concentration of the acidifying treatment agent of the step of (B) is in the range of 0.1N to 10N.

In one embodiment of the method to optimize atomic layer deposition, wherein the hydrophobic treatment agent of the step of (C) includes a $C_6$ to $C_{18}$ long carbon chain amino compound.

In one embodiment of the method to optimize atomic layer deposition, wherein the hydrophobic treatment agent of the step of (C) includes hexamine, dodecylamine, octadecylamine, hexadecyl trimethyl ammonium bromide, or octadearyl trimethyl ammonium chloride.

In one embodiment of the method to optimize atomic layer deposition, wherein the concentration of the hydrophobic treatment agent of the step of (C) is in the range of 0.1% to 5%.

This invention also provides a silicone resin film with an inorganic coating layer, which is manufactured by any one above-mentioned methods to optimize atomic layer deposition. The water vapor transmission rate (WVTR) of the silicone resin film with an inorganic coating layer is less than 1 $gm^{-2}day^{-1}$.

This invention also provides an optical semiconductor device, wherein the optical semiconductor device is encapsulated by the above-mentioned silicone resin film with an inorganic coating layer.

DETAILED DESCRIPTION OF THE INVENTION

These and other aspects of the invention will become apparent from the following description of the presently preferred embodiments. The detailed description is merely illustrative of the invention and does not limit the scope of the invention, which is defined by the appended claims and equivalents thereof. As would be obvious to one skilled in the art, many variations and modifications of the invention may be affected without departing from the spirit and scope of the novel concepts of the disclosure.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

In the following description, numerous specific details are described in detail in order to enable the reader to fully understand the following examples. However, embodiments of the present invention may be practiced in case no such specific details.

Unless defined otherwise, all technical and scientific terms used herein have the same meaning as commonly understood by one of ordinary skill in the art to which this invention belongs. Generally, the nomenclature used herein and the laboratory procedures are well known and commonly employed in the art. Conventional methods are used for these procedures, such as those provided in the art and various general references. Where a term is provided in the singular, the inventors also contemplate the plural of that term. The nomenclature used herein and the laboratory procedures described below are those well-known and commonly employed in the art.

The method to optimize atomic layer deposition according to this invention comprises the following steps: (A) providing a cellulose nanofiber; (B) acidifying the cellulose nanofiber by an acidifying treatment agent; (C) hydrophobing the acidified cellulose nanofiber by a hydrophobic treatment agent; (D) dissolving the acidified and hydrophobed cellulose nanofiber in a solvent to form a cellulose nanofiber solution; (E) coating the cellulose nanofiber solution on a silicone resin film; (F) heating the coated silicone resin film to form a cellulose nanofiber layer on a surface of the silicone resin film; and (G) forming an inorganic coating layer on the surface of the silicone resin film having the cellulose nanofiber layer by atomic layer deposition.

Cellulous nanofibers are fibers made of wood, which can be obtained by minimizing the paper pula or cellulous made of common bits of wood. Conventional cellulous nanofiber has a width of 1 nm to 20 nm, and has a length of 100 nm to 3000 nm. The paper pula or cellulous can be minimized in water or aqueous mediums by conventional milling methods such as minimized by a mill, a high-pressure homogenizer, a media mixing mill, a stone mortar, a polisher, a biaxial extrusion machine or a bead mill, or minimized by microorganisms. The cellulous nanofibers can also be obtained in the absent of water or aqueous mediums by adding the cellulous or paper pula into the fibrillation resin and mechanically cutting the fibrillation resin added with cellulous or paper pula to generate the cellulous nanofibers. The cellulous nanofibers can also be obtained by dissolving the cellulous by solvents and electrospinning thereafter. The cellulous nanofibers can also be obtained from the electrostatic repulsion caused by the oxidation of cellulous in the paper pula by an oxidant or a catalyst. According to one embodiment of this invention, suitable cellulous nanofibers can be, for example, but not limited to TEMPO-oxidized cellulose nanofiber generated by oxidizing the primary hydroxyl group on the glucose chain of the paper pulp by using the 2,2,6,6-tetra-methyl-piperidinyl-1-oxyl radical as the catalyst.

According to one embodiment of this invention, the acidifying treatment agent can comprise, for example, but not limited to hydrochloric acid, sulfuric acid, nitric acid, acetic acid or triflic acid. The pH value of the acidifying treatment agent is in the range of 1 to 4. In one embodiment of this invention, the pH value of the acidifying treatment agent is 2. The concentration of the acidifying treatment agent is in the range of 0.1N to 10N. In one embodiment of this invention, the acidifying treatment agent is aqueous hydrochloric acid with a concentration of 1N.

Cellulous nanofibers are highly hydrophilic, so they can be pretreated by a hydrophobic treatment agent before coated on the hydrophobic surface of the silicone resin to enhance the compatibility between the cellulous nanofibers and the silicone resin and efficiently provide the silicone resin with a moist surface. The hydrophobic treatment agent can comprise, for example, but not limited to $C_6$ to $C_{18}$ long carbon chain amino compounds. Suitable hydrophobic treatment agent can include hexamine, dodecylamine, octadecylamine, hexadecyl trimethyl ammonium bromide, or octadearyl trimethyl ammonium chloride, and the concentration thereof is in the range of 0.1% to 5%. According to one embodiment of this invention, the hydrophobic treatment agent is 1% dodecylamine using the iso-propanol as solvent.

After acidifying and hydrophobing treatment, a cellulous nanofiber solution can be obtained by dissolve the acidified and hydrophobed cellulous nanofiber in a solvent. Suitable solvents can be, for example, at least one of water, toluene, methanol, ethanol, iso-propanol, proprylene glycol monomethyl ether, tert-butanol, butanone and tetrahydrofuran, or combinations thereof. The concentration of the cellulous nanofiber solution can be in the range of 0.05% to 0.3%.

The silicone resin film according to this invention can be, for example, but not limited to conventional silicone resin films for encapsulating LEDs. According to one embodiment of this invention, the silicone resin film can be formed by curing a curable silicone resin composition, wherein the curable silicone resin composition can comprise but not limited to: 10 to 25 parts by weight of a linear polysiloxane; 40 to 55 parts by weight of a first silicone resin; 15 to 30 parts by weight of a second silicone resin; 15 to 25 parts by weight of a polysiloxane comprising silicone-hydrogen bond; and a platinum group metal catalyst.

According to one embodiment of this invention, the unit structure of the linear polysiloxane can be represented as $(PhMeSiO_{2/2})_{0.7}(Me_2SiO_{2/2})_{0.2}(ViMeSiO_{2/2})_{0.1}$ and end-capped by $ViMe_2SiO_{1/2}$ monomer, wherein Ph represents the phenyl group, Me represents the methyl group, and Vi represents the vinyl group. The weight average molecular weight of the linear polysiloxane is about 1,000 to 200,000, and preferably is about 1,000 to 160,000. The viscosity of the linear polysiloxane at 25° C. is not restricted but preferably is in the range of about 6,000 mPa·S to 10,000 mPa·s. The linear polysiloxane can enhance the workability between the first silicone resin and the second silicone resin and the flexibility of the obtained silicone resin film.

According to one embodiment of this invention, the unit structure of the first silicone resin can be represented as $(PhSiO_{3/2})_{0.7}(Me_2SiO_{2/2})_{0.2}(ViMeSiO_{2/2})_{0.1}$ and end-capped by $ViMe_2SiO_{1/2}$ monomer, wherein Ph represents the phenyl group, Me represents the methyl group, and Vi represents the vinyl group. The weight average molecular weight of the first silicone resin is about 500 to 200,000, and preferably about 1,000 to 190,000.

According to one embodiment of this invention, the unit structure of the second silicone resin can be represented as $(PhSiO_{3/2})_{0.5}(ViMe_2SiO_{1/2})_{0.5}$, wherein Ph represents the phenyl group, Me represents the methyl group, and Vi represents the vinyl group. The weight average molecular weight of the second silicone resin is about 100 to 10,000, and preferably about 500 to 5,000.

According to one embodiment of this invention, the structure formula of the polysiloxane comprising silicone-hydrogen bond can be represented as $(Ph_2SiO_{2/2})_1(HMe_2SiO_{1/2})_2$, wherein Ph represents the phenyl group and Me represents the methyl group. The weight average molecular weight of the polysiloxane comprising silicone-hydrogen bond is about 100 to 5,000, and preferably about 100 to 1,000. Optionally, more than one polysiloxanes comprising silicone-hydrogen bond can be mixed into the curable resin composition.

Suitable platinum group metal catalysts can be, for example, platinum based catalyst, rhodium based catalyst or palladium based catalyst, and preferably is platinum based catalyst. The common used catalysts can be, for example, $H_2PtCl_6 \cdot mH_2O$, $K_2PtCl_6$, $KHPtCl_6 \cdot mH_2O$, $K_2PtCl_4$, $K_2PtCl_4 \cdot mH_2O$ or $PtO_2 \cdot mH_2O$ (m is an positive integer). The complex of these catalysts with olefin, alcohol or organopolysiloxane containing vinyl groups can be also used, for example, platinum(0)-2,4,6,8-tetramethyl-2,4,6,8-tetravinylcyclotrasiloxane complex solution or Platinum-Octanal/Octanol complex, but not limited to these compounds. These platinum group metal catalysts can be used alone or in combination. The addition amount of the platinum group metal catalyst is in the range of about 1 ppm to 50 ppm on the total weight of the linear polysiloxane, the first silicone resin, the second silicone resin and the polysiloxane comprising silicone-hydrogen bond and preferably is in the range of about 3 ppm to about 10 ppm.

Optionally, according to one embodiment of this invention, the water vapor barrier property of the silicone resin film can be enhanced by adding certain ratio of microsheets into the curable silicone resin composition. Suitable microsheet can be, for example, at least one of mica, clay, layered double hydroxide, calcium hydrogen phosphate and boron nitride, or combinations thereof. The aspect ratio of each microsheet is in the range of 10 to 200, and preferably in the range of 50 to 200. The length of each microsheet is in the range of 0.1 μm to 25 μm, and preferably in the range of 2 μm to 25 μm. The thickness of each microsheet is in the range of 10 nm to 1000 nm, and preferably in the range of 10 nm to 400 nm.

According to one embodiment of this invention, the microsheets within the curable silicone resin can be further modified by silicone to enhance its hydrophobic property to prevent microsheets within the curable silicone resin from being aggregate. According to one preferred embodiment of this invention, the microsheet within the curable silicone resin is silicone modified mica.

The content of microsheets within the curable silicone resin is in the range of 10 to 40 parts by weight. When the content of microsheets within the curable silicone resin is too high, the haze of the silicone resin film will be increased which will result in decreasing the emitting efficiency of LEDs. When the content of microsheets within the curable silicone resin is too low, the water vapor transmission rate (WVTR) of the silicone resin film can't be enhanced.

The curable silicone resin composition of the silicone resin film according to this invention can further comprise an inhibitor, a thixotropic agent, an anti-setting agent, an inorganic filler, a phosphor, or combinations thereof.

The above-mentioned inorganic fillers are used to enhance the heat-resistance of the silicone resin film, and also be used to prevent phosphor from setting and act as reflective particles. The inorganic fillers can be, for example, but not limited to fumed silica and gas-phase titanium dioxide, or non-enhanced inorganic fillers, for example, but not limited to calcium carbonate, silicon carbonate, titanium dioxide, titanium oxide and zinc oxide.

According to one embodiment of this invention, the curable silicone resin of the silicone resin film further comprises 0.1 to 5 parts by weight of fumed silica relative to 100 parts by weight of the total amount of the linear polysiloxane, the first silicoe resin, the second silicone resin and the polysiloxane comprising silicone-hydrogen bond.

The method for coating the cellulous nanofiber solution on the surface of the silicone resin film can be a conventional coating method, but not limited thereto. Then, a heating treatment is proceeded to form a cellulous nanofiber layer on the surface of the silicone resin film. According to one embodiment of this invention, the heating treatment is proceed at the temperature in the range of 40° C. to 120° C. for 1 minute to 30 minutes. The thickness of the cellulous nanofiber layer is in the range of 0.2 nm to 1.6 nm.

By forming the cellulous nanofiber layer silicone, a plurality of hydrophilic hydroxyl groups necessary for following atomic layer deposition are present on the hydrophobic surface of the silicone resin film, which will contribute to the subsequent forming of the inorganic coating layer by the atomic layer deposition. Besides, the coefficient of thermal expansion (CTE) of the cellulous nanofiber layer is smaller which can benefit the subsequent workability, thereof the coating quality can be further enhanced.

After the cellulous nanofiber layer is formed on the surface of the silicone resin film, an inorganic coating layer is formed on the cellulous nanofiber layer by atomic layer deposition.

Atomic layer deposition is a vapor thin film deposition, wherein the thin film is deposited by the reaction products of the stable gas precursors. The inorganic coating film includes, for example, but not limited to one of $SiO_2$, $Al_2O_3$ and $HfO_2$, or combinations thereof. According to one embodiment of this invention, the inorganic coating layer is Al₂O₃ coating layer. According to another preferred embodiment of this invention, the inorganic coating layer is Al$_2$O$_3$/HfO$_2$ coating layer.

According to one embodiment of this invention, the thickness of the inorganic coating layer is in the range of 10 nm to 300 nm, and preferably in the range of 20 nm to 30 nm.

This invention also provides a silicone resin film with an inorganic coating layer which is obtained by the above-mentioned method to optimize atomic layer deposition, wherein the water vapor transmission rate (WVTR) of the silicone resin film is less than 1 gm$^{-2}$day$^{-1}$.

This invention also provides an optical semiconductor device, which is encapsulated by one of above-mentioned silicone resin films with an inorganic coating layer.

The following examples are intended to further illustrate the invention, but the invention is not limited thereto.

EXAMPLES

Preparation Example 1: Preparation of the Linear Polysiloxane (Compound A)

3499.92 g (19.13 moles) of phenylmethyl dimethoxysilane (commercially available from Chembidge, Taiwan), 288.48 g (2.4 moles) of dimethydimethoxysilane (commercially available from Chembidge, Taiwan), and 317.28 g (2.4 moles) of methylvinyldimethoxysilane (commercially available from Union Chemical Ind. Co., Ltd. (Union), Taiwan) were added to a reaction tank and mixed by stirring at ambient temperature to a homogenous solution. The mixed solution was dropped into a 5% aqueous sulfuric acid solution (5337.4 g) to obtain a reaction solution. Next, the reaction solution was heated to 75° C. to conduct a hydrolysis reaction. After the hydrolysis reaction was completed, the organic phase was extracted by deionized water to reach a neutral state and then removed the organic solvent to obtain a hydrolysis product.

The hydrolysis product 69.52 g (0.374 mole) of divinyltetramethyldisiloxane (commercially available from Union) and 5.88 g of tetramethyl ammonium hydroxide (brand name L09658, commercially available from Alfa Aesar, USA) were placed into a reaction tank. Nitrogen was fed into the reaction tank and the mixture was stirred at ambient temperature to obtain a reaction solution. The reaction solution was heated to 95° C. After the reaction was completed, the reaction solution was conducted an alkaline removing to complete the preparation of Compound A. The average composition formula of the Compound A is (PhMeSiO$_{2/2}$)$_{0.7}$(Me$_2$SiO$_{2/2}$)$_{0.2}$(ViMeSiO$_{2/2}$)$_{0.1}$ with end-cap unit ViMe$_2$SiO$_{1/2}$, wherein Ph represents phenyl group, Me represents methyl group and Vi represents vinyl group.

Example 2: Preparation Example 2: Preparation of the First Silicone Resin (Compound B)

2776 g (14 mole) of phenyl-trimethoxysilane (commercially available from Union, Taiwan), 480.88 g (4 moles) of dimethyl dimethoxysilane (commercially available from Chembridg, Taiwan), and 264.46 g (2 moles) of methylvinyldimethoxysilane (commercially available from Union, Taiwan) were placed in a reaction tank. The mixture was stirred at ambient temperature to obtain a homogenous solution. The mixed solution was dropped into 5% aqueous sulfuric acid solution to prepare a reaction solution. Then, this reaction solution was heated to 75° C. to conduct a hydrolysis reaction. After the reaction completed, the organic phase was extracted by deionized water and moved the solvent to obtain a hydrolysis product.

The hydrolysis product, 21.39 g (0.11 moles) of divinyltetramethyldisiloxane (commercially available from Union, Taiwan), 22.74 g of potassium hydroxide and 2274 g of toluene were placed into a reaction tank. Nitrogen was fed into the reaction tank and the mixture was stirred at ambient temperature to obtain a reaction solution. Next, the reaction solution was heated to 95° C. After the reaction was completed, the organic phase was extracted by deionized water until the organic phase reached neutral, and then removed the solvent to obtain Compound B. The average composition formula of Compound B was (PhSiO$_{3/2}$)$_{0.7}$(Me$_2$SiO$_{2/2}$)$_{0.2}$(ViMeSiO$_{2/2}$)$_{0.1}$ with end-cap unit ViMe$_2$SiO$_{1/2}$.

Preparation Example 4: Preparation of the Second Silicone Resin (Compound C)

2379.4 g (12 moles) of phenyl-trimethoxysilane (commercially available from Union, Taiwan) and 1118.4 g (6 moles) of divinyltetramethyldisiloxane (commercially available from Union, Taiwan) were placed into a reaction tank. The mixture was stirred at ambient temperature until obtaining a homogenous solution. The mixed solution was dropped into 5% aqueous sulfuric acid solution (4547.16 g) to prepare a reaction solution. Then, this mixture solution was heated to 75° C. to conduct hydrolysis. After the reaction was completed, the organic phase was extracted by deionized water until the organic phase reached neutral and next, removed solvent to obtain a hydrolysis product.

The hydrolysis product, 1998 g of toluene and 10 g of potassium hydroxide were placed into a reaction tank. Nitrogen was fed into the reaction tank and the mixture was stirred at ambient temperature to prepare a reaction solution. Then, the reaction solution was heated to 85° C. After the reaction was completed, the organic phase was extracted by deionized water until the organic phase reached neutral and then, the solvent was removed to obtain Compound C. The average composition formula of Compound C was (PhSiO$_{3/2}$)$_{0.5}$(ViMe$_2$SiO$_{1/2}$)$_{0.5}$.

Preparation Example 4: Preparation of Si—H Containing Polysiloxane (Compound D)

3432.04 g (14 moles) of Diphenyldimethoxysilane (commercially available from Union), and 1880.62 g (14 moles) of 1,1,3,3-Tetramethyldisiloxane (commercially available from Chembridge) were placed into a reaction tank. The mixture was stirred at ambient temperature until obtaining a homogenous solution. The mixed solution was dropped into 5% aqueous sulfuric acid solution (2669 g) to prepare a reaction solution. Then, this mixture solution was heated to 75° C. to conduct hydrolysis for 4 hours. After the reaction was completed, the organic phase was extracted by deionized water until the organic phase reached neutral and then, the solvent was removed to obtain Compound D. The average composition formula of the Compound D was (Ph$_2$SiO$_{2/2}$)$_{0.33}$(HMe$_2$SiO$_{1/2}$)$_{0.67}$.

Preparation Example 5: Preparation of Si—H Containing Polysiloxane (Compound E)

2776 g (14 moles) of phenyltrimethoxysilane (commercially available from Union), and 1880.62 g (14 moles) of 1,1,3,3-Tetramethyldisiloxane (commercially available from Chembridge) were placed into a reaction tank. The mixture was stirred at ambient temperature until obtaining a homogenous solution. The mixed solution was dropped into 5% aqueous sulfuric acid solution (2669 g) to prepare a reaction solution. Then, the hydrolysis of this mixture solution was conducted at room temperature for 4 hours. After the reaction was completed, the organic phase was extracted by deionized water until the organic phase reached neutral and then, the solvent was removed to obtain Compound E. The average composition formula of the Compound E was $(PhSiO^{3/2})_{0.33}(HMe2SiO^{1/2})_{0.67}$.

Preparation Example 6: Preparation of Cellulous Nanofiber Solution 10 g of 2% TEMPO—oxidized cellulose nanofiber dispersion (TEMPO-Cellulose Nano Fibril with a carboxyl content of 1.46 mmol/g, purchased from Cellulose Lab, CA) was placed into a reaction tank and diluted to 0.1 w/w % by adding with 190 g of secondary de-ionic water, then sonicated until homogenous by high power sonication. Next, the cellulous nanofiber solution was acidified till the pH value equal to 2 by dropping into 1N aqueous sulfuric acid solution. Then, extra water was filed out by a PTFE membrane filter with a pore size of 0.1 μm, and the filter cake was washed by secondary de-ionic water till the pH value of the filtrate greater than 4. After the filtration was done, the solvent was changed as secondary de-ionic water: iso-propanol (1:1 v/v) to generate a cellulous nanofiber solution with a concentration of 0.1 w/v %. Next, 0.054 g of dodecylamine (purchased from Sigma-Aldrich, USA) was placed in a beaker, and the iso-propanol was used as solvent to prepare a 1% dodecylamine solution, and then dropped into the cellulous nanofiber solution with a concentration of 0.1 w/v % and continuously stirred to proceed hydrophobic reaction. When the hydrophobic reaction was finished, the mixture was sonicated till homogenous by high power sonication to generate a cellulous nanofiber-dodecylamino coordination solution. Then, 600 g of secondary de-ionic water was added into the cellulous nanofiber-dodecylamino coordination solution, and continuously stirred to precipitate. Colloid cellulous nanofiber-dodecylamino coordination compound was obtained after extra water was filtered by a PTFE membrane filter with a pore size of 0.1 μm and the filter cake was washed with iso-propanol till the filter cake was colloid. Cellulous nanofiber-dodecylamino coordination compound solutions with a concentration of 0.05% and 0.3 were obtained by using the iso-propanol as solvent.

Example 1

Firstly, 47.84 g of Compound B, 19.53 g of Compound C, 15.96 g of Compound D, 2.05 g of Compound E, 1000 ppm (based on 100 g of Compound A, Compound B, Compound C, Compound D and Compound E) of 1-ethynyl-cyclohexanol as an inhibitor, and 1.5 g of fumed silica (brand name TS-720, commercially available from Cabot Corp., USA) were placed into a reaction vessel to prepare a first solution. Into another reaction vessel, 14.3 g of Compound 1, and 4.3 ppm (based on 100 g of Compound A, Compound B, Compound C, Compound D and Compound E) of platinum-octanal/octanol complex (commercially available from Gelest, USA) were placed to prepare a second solution. The first solution, the second solution, 30 g of methyl silicone modified mica lamellas (commercially available from Alplus Company Limited, Taiwan), 27 g of toluene as solvent and equal amount of above-mentioned materials Zirconium beads with a thickness of 0.33 mm were mixed and stirred thoroughly by a Planetary Centrifugal Mixer (Thinky ARV-310), and then coated on a PET substrate and cured at 80° C. for 15 minutes and cured at 150° C. for 3 hours. Thereafter, a silicone resin film with a thickness of 50 μm can be obtained after the PET substrate was removed. The Coefficient of Thermal Expansion (CTE) of the silicone resin film is 23.3 ppm, and the contact angle thereof is 96.9°.

The obtained silicone resin film was placed on a hot plate of 60° C., then the cellulous nanofiber-dodecylamino coordination solution with a concentration of 0.05% obtained from the Preparation Example 6 was coated on the silicone resin film and dried on the hot plate of 60° C. for 5 minutes to generate a cellulous nanofiber layer with a thickness of 0.8 μm.

The Coefficient of Thermal Expansion (CTE) of the silicone resin film with a cellulous nanofiber layer formed thereon was measured by the Thermal Mechanical Analyzer (TMA from TA instrument) according to ASTM E831, at 30-100° C. increasing by 10° C./min, and under the tension of 0.0023N. The Coefficient of Thermal Expansion (CTE) of the silicone resin film with a cellulous nanofiber layer formed thereon at 25-50° C. is about 22.7 ppm, and the contact angle thereof is about 83.8°.

Next, the surface of the silicone resin film with the cellulous nanofiber layer was pre-treated with $O_2$ plasma, and an $Al_2O_3/HfO_2$ coating layer with a thickness of 20 nm was coated on the surface of the cellulous nanofiber layer of the silicone resin film by an i-SA (obtained from Syskey Technology, Taiwan) according to atomic layer deposition (ALD) technology by using $Al(CH_3)_3$ and tetrakis(ethylmethylamino)hafnium (TEMAHF) as precursors, using $H_2O$ as the oxidant and using high purity nitrogen as the blowing gas and the carrier gas at the working pressure of 1 ton and at the temperature of 50° C.

Example 2

Another silicone resin film was manufactured by the same method as mentioned in Example 1, and the obtained silicone resin film was placed on a hot plate of 60° C., then the cellulous nanofiber-dodecylamino coordination solution with a concentration of 0.3% obtained from the Preparation Example 6 was coated on the silicone resin film and dried on the hot plate of 60° C. for 5 minutes to generate a cellulous nanofiber layer with a thickness of 0.94 μm.

The Coefficient of Thermal Expansion (CTE) of the silicone resin film with a cellulous nanofiber layer formed thereon was measured by the Thermal Mechanical Analyzer (TMA from TA instrument) according to ASTM E831, at 30-100° C. increasing by 10° C./min, and under the tension of 0.0023N. The Coefficient of Thermal Expansion (CTE) of the silicone resin film with a cellulous nanofiber layer formed thereon at 25-50° C. is about −16.0 ppm, and the contact angle thereof is about 85°.

Next, the surface of the cellulous nanofiber layer was pre-treated with $O_2$ plasma, and an $Al_2O_3/HfO_2$ coating layer with a thickness of 20 nm was coated on the surface of the cellulous nanofiber layer of the silicone resin film by an i-SA (obtained from Syskey Technology, Taiwan) according to atomic layer deposition (ALD) technology by using $Al(CH_3)_3$ and tetrakis(ethylmethylamino)hafnium (TEMAHF) as precursors, using $H_2O$ as the oxidant and using high purity nitrogen as the blowing gas and the carrier gas at the working pressure of 1 torr and at the temperature of 50° C.

Comparative Example 1

An $Al_2O_3/HfO_2$ coating layer was coated on the surface of a silicone resin film without coating with a cellulous nanofiber-dodecylamino coordination solution by the same method as mentioned in Example 1.

The method to optimize atomic layer deposition according to this invention was evaluated by following methods. The measurement results are shown in Table 1.

Measurement of Water Vapor Transmission Rate (WVTR)

The water vapor transmission rate (WVTR) was measured by Moconaquatran model 1 (Measurement range: 5-5×10$^{-5}$gm$^{-2}$day$^{-1}$) according to ASTM F1249, at 25° C., with 90% relative humidity (RH). The sample size used for measurements was 0.5-5 cm$^2$.

Measurement of Transmittance (T %)

The transmittance between wavelength of 380-700 nm was measured by the Spectrophotometer U4100 (from Hitachi, Japan).

Observation of Film Appearance

The film appearance of each silicon resin film was observed by the Olympus OLS5000 3D laser microscope.

Symbol ⊚ denotes there is no crack observed on the appearance of the silicon resin film.

Symbol Δ denotes there are some minor cracks observed on the appearance of the silicon resin film.

Symbol X denotes there are cracks observed on the appearance of the silicon resin film.

The properties of silicone resin films of Examples 1-2 and Comparative Example 1 are shown in Table 1 below:

TABLE 1

| | WVTR (gm$^{-2}$day$^{-1}$) | Transmittance (%) | Film Appearance |
|---|---|---|---|
| Example. 1 | 0.96 | 95.41 | ⊚ |
| Example. 2 | 0.98 | 94.63 | ⊚ |
| Comparative Example. 1 | 3.93 | 95.43 | Δ |

As the measurement results shown in Table 1, the water vapor transmission rate (WVTR) of the silicone resin films of Examples 1 and 2 are all smaller than that of the silicone resin films of Comparative Examples 1 because the cellulous nanofiber layer respectively formed on the silicone resin films of Examples 1 and 2 result in better hydrophilic property and lower Coefficient of Thermal Expansions (CTE) thereof, which will provide better workability for subsequent forming of a non-crackles inorganic coating layer formed thereon by atomic layer deposition, thereby the silicone resin film with the inorganic coating layer formed thereon can provide better water vapor barrier property and maintain excellent optical properties of the silicone resin film.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A method to optimize atomic layer deposition, comprising the following steps:
   (A) providing a cellulose nanofiber;
   (B) acidifying the cellulose nanofiber by an acidifying treatment agent;
   (C) hydrophobing the acidified cellulose nanofiber by a hydrophobic treatment agent;
   (D) dissolving the acidified and hydrophobed cellulose nanofiber in a solvent to form a cellulose nanofiber solution;
   (E) coating the cellulose nanofiber solution on a silicone resin film;
   (F) heating the coated silicone resin film to form a cellulose nanofiber layer on a surface of the silicone resin film; and
   (G) forming an inorganic coating layer on the surface of the silicone resin film having the cellulose nanofiber layer by atomic layer deposition.

2. The method to optimize atomic layer deposition as claimed in claim 1, wherein the concentration of the cellulose nanofiber solution of step of (D) is in the range of 0.05 wt % to 0.3 wt %.

3. The method to optimize atomic layer deposition as claimed in claim 1, wherein the solvent of step of (D) is selected from at least one of the group consisting of water, toluene, methanol, ethanol, iso-propanol, proprylene glycol monomethyl ether, tert-butanol, butanone and tetrahydrofuran, or combinations thereof.

4. The method to optimize atomic layer deposition as claimed in claim 1, wherein the thickness of the cellulose nanofiber layer of step of (F) is in the range of 0.2 μm to 1.6 μm.

5. The method to optimize atomic layer deposition as claimed in claim 1, wherein the heating treatment of step (F) is proceed at the temperature in the range of 40° C. to 120° C. for 1 minute to 30 minutes.

6. The method to optimize atomic layer deposition as claimed in claim 1, wherein the thickness of the inorganic coating layer of the step of (G) is in the range of 10 nm to 300 nm.

7. The method to optimize atomic layer deposition as claimed in claim 1, wherein the inorganic coating layer of the step of (G) includes $SiO_2$, $Al_2O_3$, $HfO_2$, or combinations thereof.

8. The method to optimize atomic layer deposition as claimed in claim 1, wherein the acidifying treatment agent of the step of (B) includes hydrochloric acid, sulfuric acid, nitric acid, acetic acid or triflic acid.

9. The method to optimize atomic layer deposition as claimed in claim 8, wherein the concentration of the acidifying treatment agent of the step of (B) is in the range of 0.1 N to 10 N.

10. The method to optimize atomic layer deposition as claimed in claim 1, wherein the hydrophobic treatment agent of the step of (C) includes a $C_6$ to $C_{18}$ long carbon chain amino compound.

11. The method to optimize atomic layer deposition as claimed in claim 1, wherein the hydrophobic treatment agent of the step of (C) includes hexamine, dodecylamine, octadecylamine, hexadecyl trimethyl ammonium bromide, or octadearyl dimethyl ammonium chloride.

12. The method to optimize atomic layer deposition as claimed in claim 10, wherein the concentration of the hydrophobic treatment agent of the step of (C) is in the range of 0.1 wt % to 5 wt %.

13. A silicone resin film with an inorganic coating layer, which is manufactured by the method to optimize atomic layer deposition as claimed in claim 1.

14. The silicone resin film with an inorganic coating layer as claimed in claim 13, wherein the he-water vapor transmission rate (WVTR) of the silicone resin film is less than 1 gm$^{-2}$day$^{-1}$.

15. An optical semiconductor device, wherein the optical semiconductor device is encapsulated by the silicone resin film with an inorganic coating layer as claimed in claim 13.

\* \* \* \* \*